(12) United States Patent
Khoshnood et al.

(10) Patent No.: US 9,915,680 B2
(45) Date of Patent: Mar. 13, 2018

(54) LAMINATE STRUCTURE AND CLAMPING MECHANISM FOR FAULTED CIRCUIT INDICATOR

(71) Applicant: Thomas & Betts International, LLC, Wilmington, DE (US)

(72) Inventors: Bahman Khoshnood, Boca Raton, FL (US); William J. Dodds, Hackettstown, NJ (US); Camilo Delgado, Long Island City, NY (US); Robert Fong, Bethlehem, PA (US); Venket Rao Yeeli, Hyderabad (IN); Hunter Thornell Foy, Boca Raton, FL (US); Chandrashekar Srinivas, Bangalore (IN); David Martin, Okeechobee, FL (US); Larry N. Siebens, Asbury, NJ (US); Stanley Szyszko, Wall, NJ (US)

(73) Assignee: Thomas & Betts International LLC, Wilmington, DE (US)

( * ) Notice: Subject to any disclaimer, the term of this patent is extended or adjusted under 35 U.S.C. 154(b) by 349 days.

(21) Appl. No.: 14/680,794

(22) Filed: Apr. 7, 2015

(65) Prior Publication Data

US 2015/0293146 A1 Oct. 15, 2015

Related U.S. Application Data

(60) Provisional application No. 61/978,583, filed on Apr. 11, 2014.

(51) Int. Cl.
*F16B 2/02* (2006.01)
*G01R 1/04* (2006.01)
(Continued)

(52) U.S. Cl.
CPC ............... *G01R 1/04* (2013.01); *G01R 1/22* (2013.01); *G01R 31/08* (2013.01); *F16B 2/02* (2013.01); *F16B 2/04* (2013.01); *G01R 15/146* (2013.01)

(58) Field of Classification Search
USPC ......... 248/226.11, 230.6, 231.71, 74.1, 74.2; 24/455, 459, 489, 493, 495, 499–501,
(Continued)

(56) References Cited

U.S. PATENT DOCUMENTS

| 4,165,528 A | 8/1979 | Schweitzer, Jr. |
| 4,456,873 A | 6/1984 | Schweitzer, Jr. |

(Continued)

FOREIGN PATENT DOCUMENTS

| FR | 2717582 A1 | 9/1995 |
| WO | 2013077746 A2 | 5/2013 |

OTHER PUBLICATIONS

PCT International Search Report and Written Opinion issued for corresponding international application No. PCT/US2015/024729, dated Jul. 1, 2015, 11 pages.

*Primary Examiner* — Alfred J Wujciak
(74) *Attorney, Agent, or Firm* — Taft Stettinius & Hollister LLP

(57) ABSTRACT

A faulted circuit indicator (FCI) device for installation on a power line includes a housing, a laminate structure fastened to the housing and configured to receive the power line, and a clamp mechanism pivotally fastened to the housing and configured to secure the housing to the power line. The clamp mechanism includes a pair of opposing clamp arms each having a curved configuration. The curved configuration of the clamp arms maintains the power line in a centered
(Continued)

relationship within the laminate structure when the clamp arms are engaged on the power line over a range of power line diameters.

23 Claims, 14 Drawing Sheets

(51) Int. Cl.
*G01R 31/08* (2006.01)
*G01R 1/22* (2006.01)
*F16B 2/04* (2006.01)
*G01R 15/14* (2006.01)

(58) Field of Classification Search
USPC .................................. 24/509–510, 512, 516
See application file for complete search history.

(56) References Cited

U.S. PATENT DOCUMENTS

| | | |
|---|---|---|
| 4,646,006 A | 2/1987 | Schweitzer, Jr. |
| 4,808,916 A | 2/1989 | Smith-Vaniz |
| 4,846,725 A | 7/1989 | Williams et al. |
| 5,180,972 A | 1/1993 | Schweitzer, Jr. |
| 5,397,982 A | 3/1995 | Van Lankvelt |
| 5,426,360 A | 6/1995 | Maraio et al. |
| 5,483,215 A | 1/1996 | Mies |
| 5,497,096 A | 3/1996 | Banting |
| 5,729,125 A | 3/1998 | Schweitzer, Jr. |
| 5,748,095 A | 5/1998 | Horstmann |
| 5,990,674 A | 11/1999 | Schweitzer, Jr. |
| 6,371,419 B1 * | 4/2002 | Ohnuki ............... F16L 3/13 248/71 |
| 6,963,197 B1 | 11/2005 | Feight et al. |
| 7,442,071 B2 | 10/2008 | Bigotto |
| 7,570,045 B2 | 8/2009 | Wolfe et al. |
| 7,663,459 B2 | 2/2010 | Horstmann |
| 7,956,763 B2 | 6/2011 | Mies |
| 8,159,362 B2 | 4/2012 | Swartzendruber et al. |
| 8,274,394 B2 | 9/2012 | Feight |
| 2008/0129314 A1 | 6/2008 | Ricci et al. |
| 2009/0009274 A1 | 1/2009 | Hortsmann |
| 2010/0084920 A1 | 4/2010 | Banting et al. |
| 2010/0085036 A1 | 4/2010 | Banting et al. |
| 2010/0218715 A1 | 9/2010 | Mies |
| 2011/0095750 A1 | 4/2011 | Harley et al. |
| 2011/0126677 A1 * | 6/2011 | Buchanan ............ B25B 13/461 81/60 |
| 2011/0226913 A1 * | 9/2011 | Feige ................... F16L 3/13 248/74.2 |
| 2012/0038446 A1 | 2/2012 | McBee et al. |
| 2012/0146661 A1 | 6/2012 | Thomas |

* cited by examiner

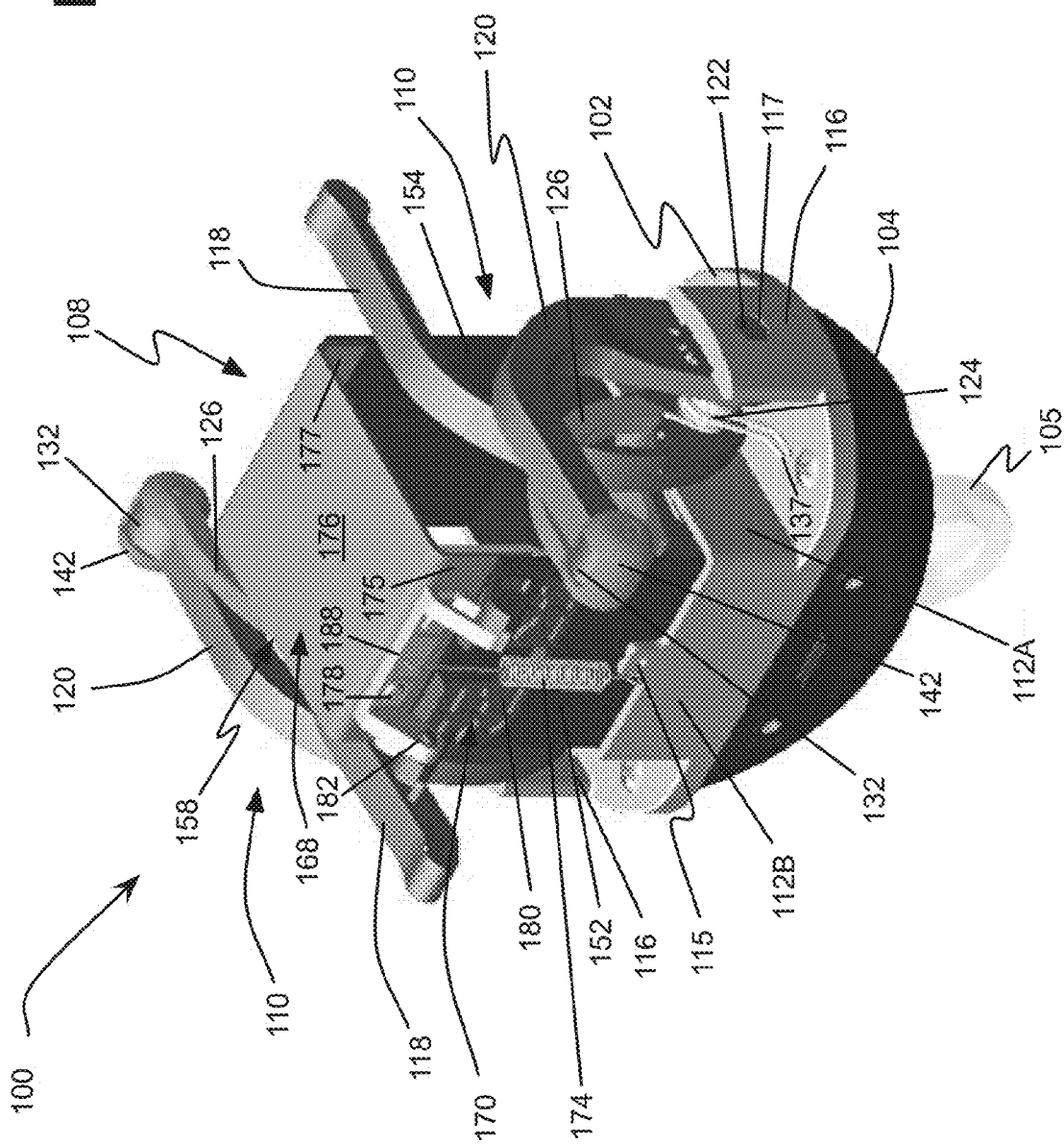

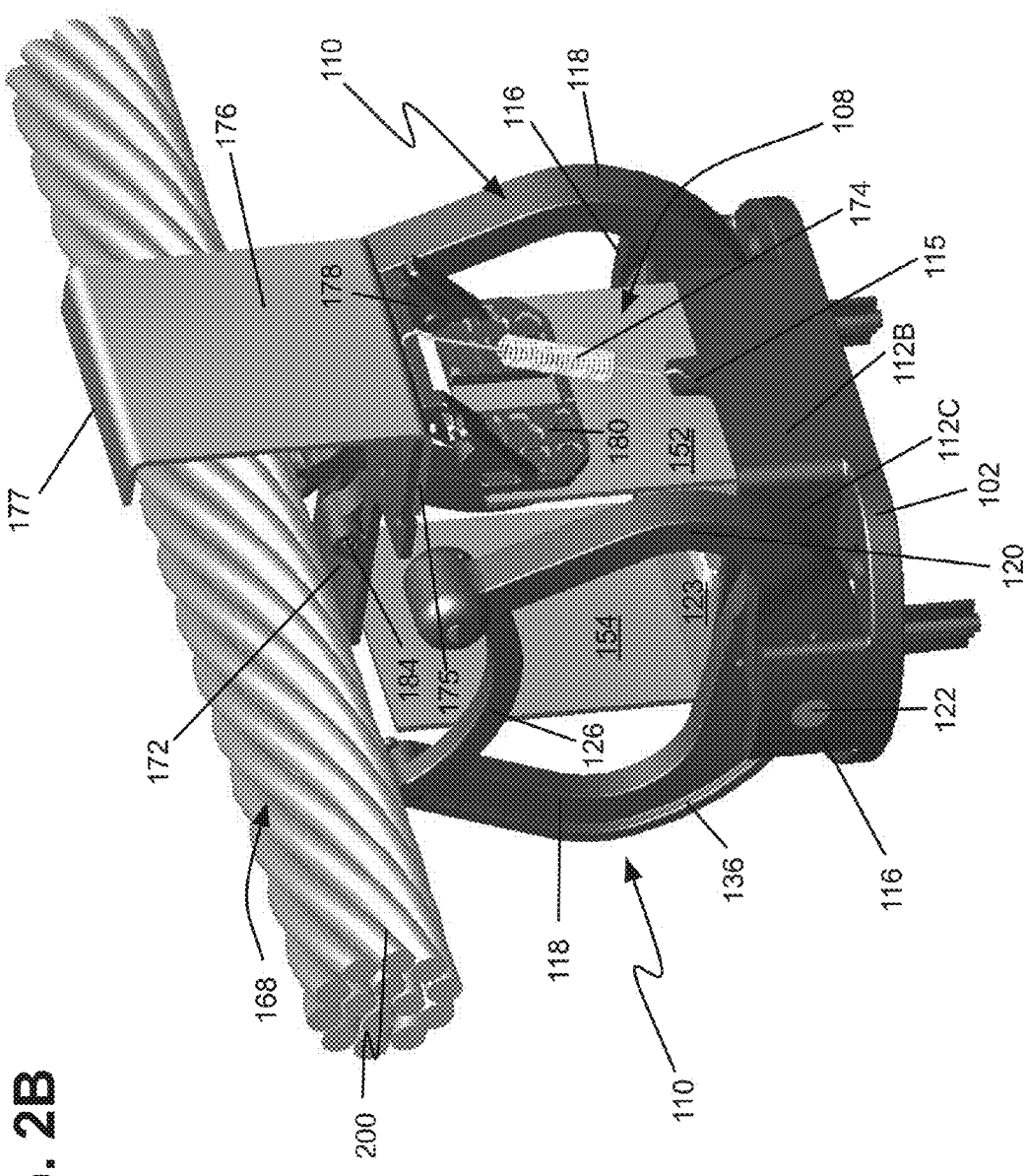

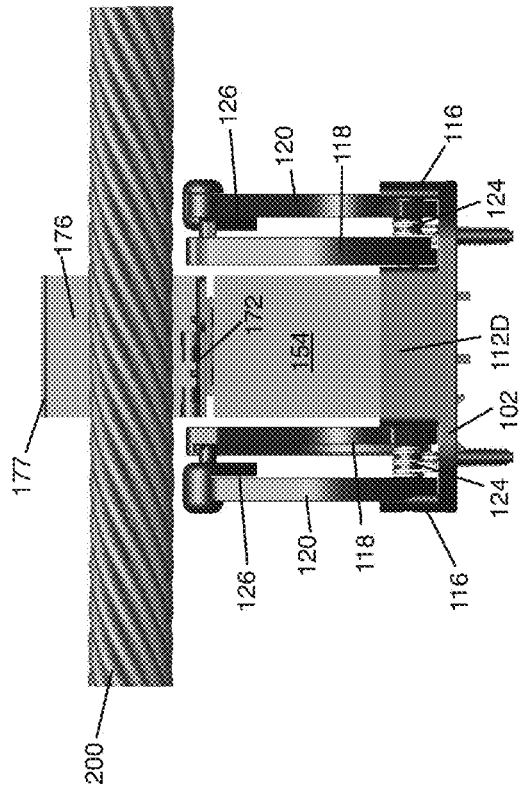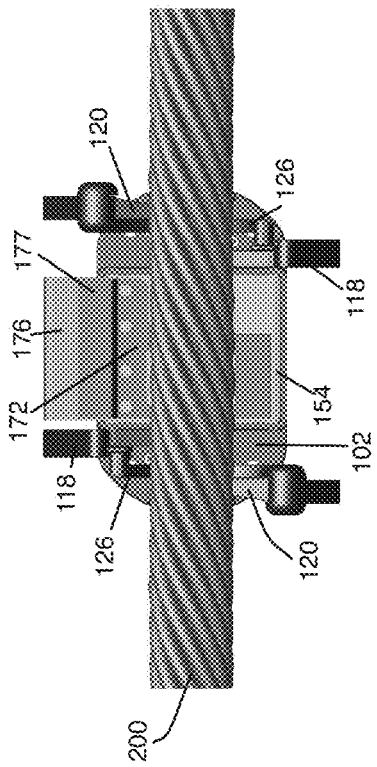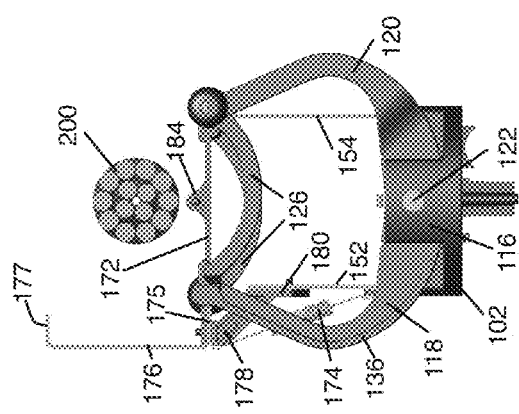

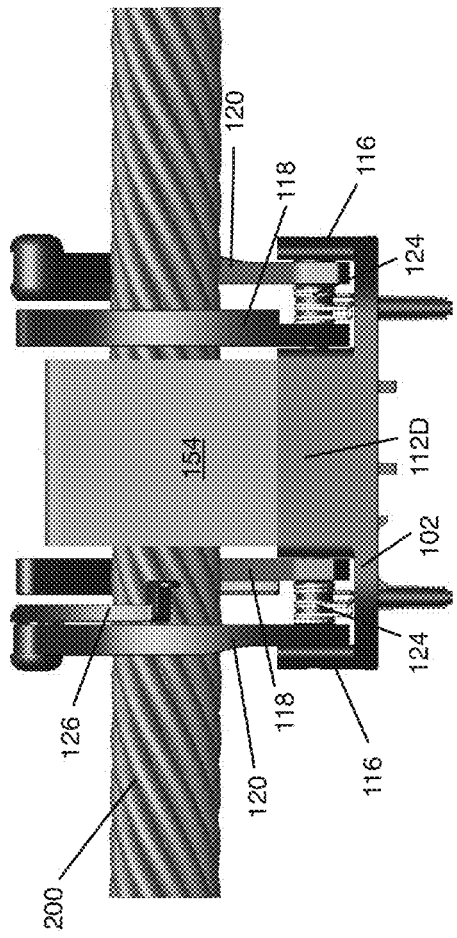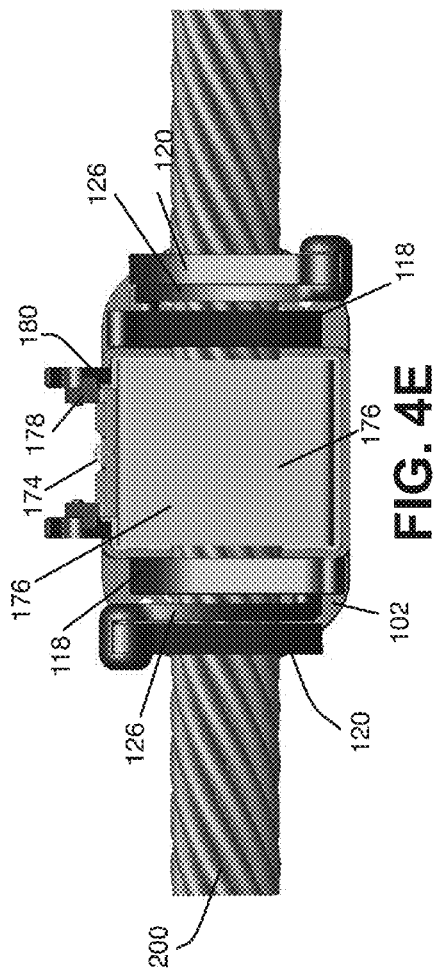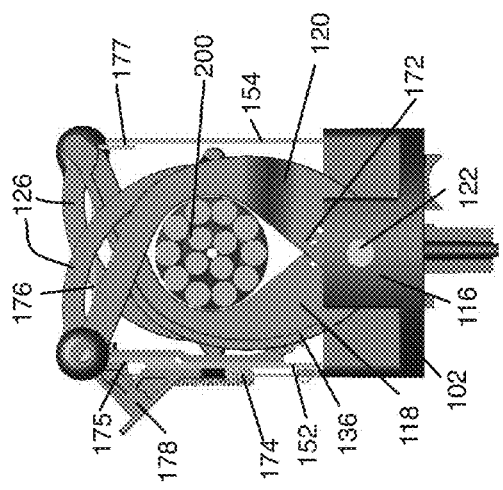

LAMINATE STRUCTURE AND CLAMPING MECHANISM FOR FAULTED CIRCUIT INDICATOR

CROSS-REFERENCE TO RELATED APPLICATION

This application claims priority under 35 U.S.C. § 119, based on U.S. Provisional Patent Application No. 61/978,583, filed Apr. 11, 2014, the disclosure of which is hereby incorporated by reference herein.

BACKGROUND OF THE INVENTION

The present invention relates to the support faulted circuit indicator (FCI) devices for use in electrical power distribution systems. More particularly, the present invention to a faulted circuit indicator device having an improved clamping mechanism.

In practice, FCI devices are placed at intervals along power lines or cables to decrease the time that it takes line crews to locate faults in utility distribution systems. Conventional FCI devices are of the clamp-on type, which typically includes a housing having fault monitor circuitry responsive to an abnormally high electric current, an indicator unit, and a clamping mechanism for mounting the housing onto overhead power lines, electrical conductor cables, bus bars, and the like.

In general, FCI devices include high current trip devices that display whether a fault has occurred between the indicator and a load. Such devices operate by responding to fluxes generated by currents in a line. Typical FCI devices include current sensors comprising a magnetic core and a surrounding coil winding. To sense the current, the power line functions as a transformer primary and the coil winding functions as a transformer secondary. A microprocessor receives a value corresponding to the sensed current and determines whether the value exceeds a threshold. If so, the microprocessor trips an indicator accordingly.

BRIEF DESCRIPTION OF THE DRAWINGS

FIG. 1 is an isometric illustration of an exemplary FCI device consistent with embodiments described herein;

FIGS. 2A and 2B are front and rear isometric illustrations, respectively, of the top housing, laminate structure, and clamp mechanism of FIG. 1 in an open configuration;

FIGS. 2C-2E are side, front, and top views, respectively, of the top housing, laminate structure, and clamp mechanism of FIG. 1 in the open configuration;

FIGS. 4C-4E are side, front, and top views, respectively, of the top housing, laminate structure, and clamp mechanism of FIG. 1 in the closed or installed configuration;

DETAILED DESCRIPTION OF EMBODIMENTS

The following detailed description refers to the accompanying drawings. The same reference numbers in different drawings may identify the same or similar elements.

Consistent with implementations described herein, an improved clamping mechanism for securing an FCI device to an overhead power line. In exemplary embodiments, the FCI device described herein includes opposing pairs of scissor-style clamp arms configured to be spring biased into a position surrounding the power line to be monitored. To facilitate efficient entry of the power line into the clamp arms, each set of clamp arms includes a trigger arm coupled to one of the clamp arms and configured to engage the other clamp arm in a manner that opposes the bias of the clamp arms, thus maintaining the clamp arms in an open configuration until a force is exerted on the trigger arms, which removes the bias opposition and allows the clamp arms to close about the power line. In addition, the FCI device includes a lamination structure configured to enclose the power line, when the power line is fully inserted within the clamp arms. The lamination structure is configured to couple flux arising from the current in the power line to a coil winding of the FCI. As described herein, the lamination structure includes a hinged portion that allows the power line to enter the clamp arms when in the open position. As the power line enters the clamp arms, the movement of the power line causes the hinged portion of the lamination structure to close, thereby forming the laminate structure into an uninterrupted conductive enclosing the power line.

Figure 2A:
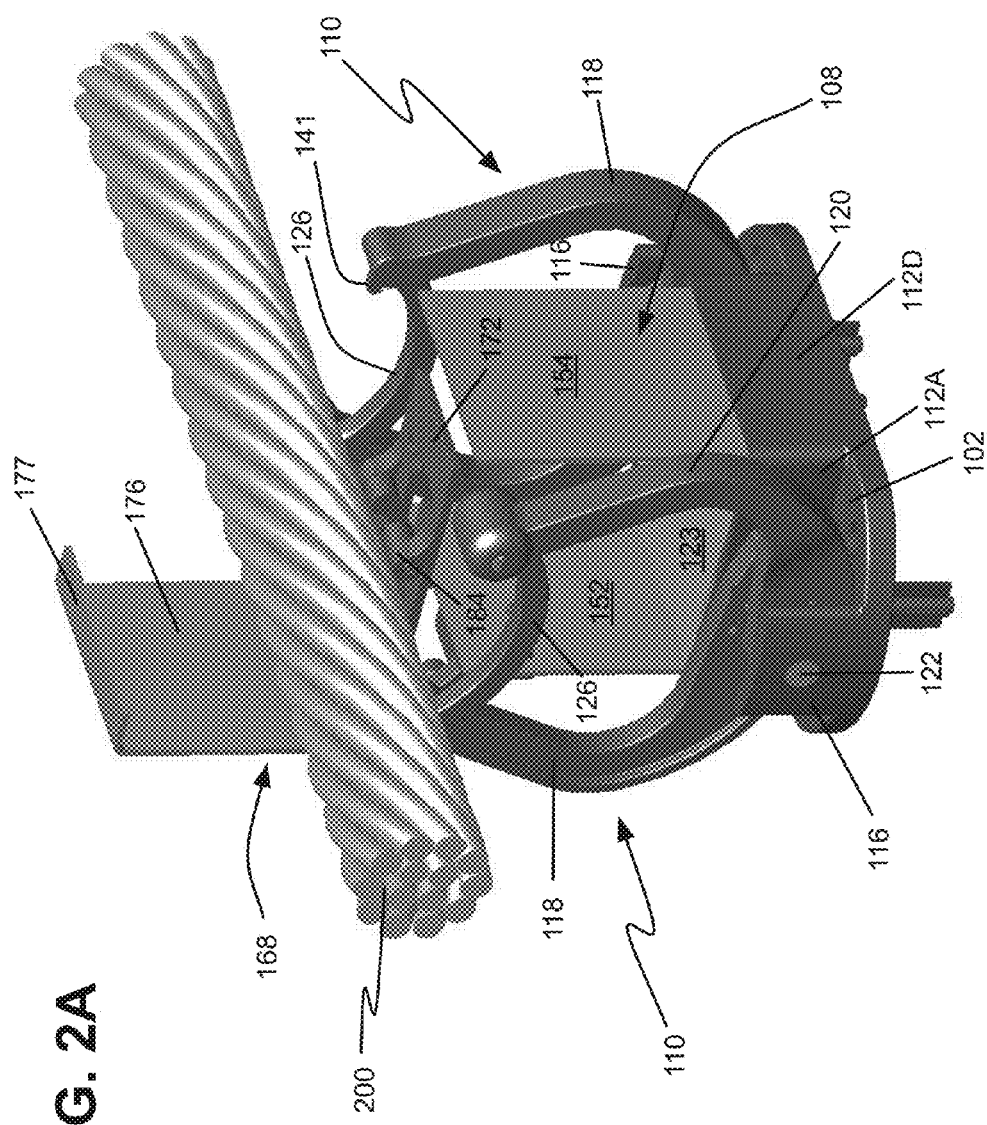
Figure 3A:
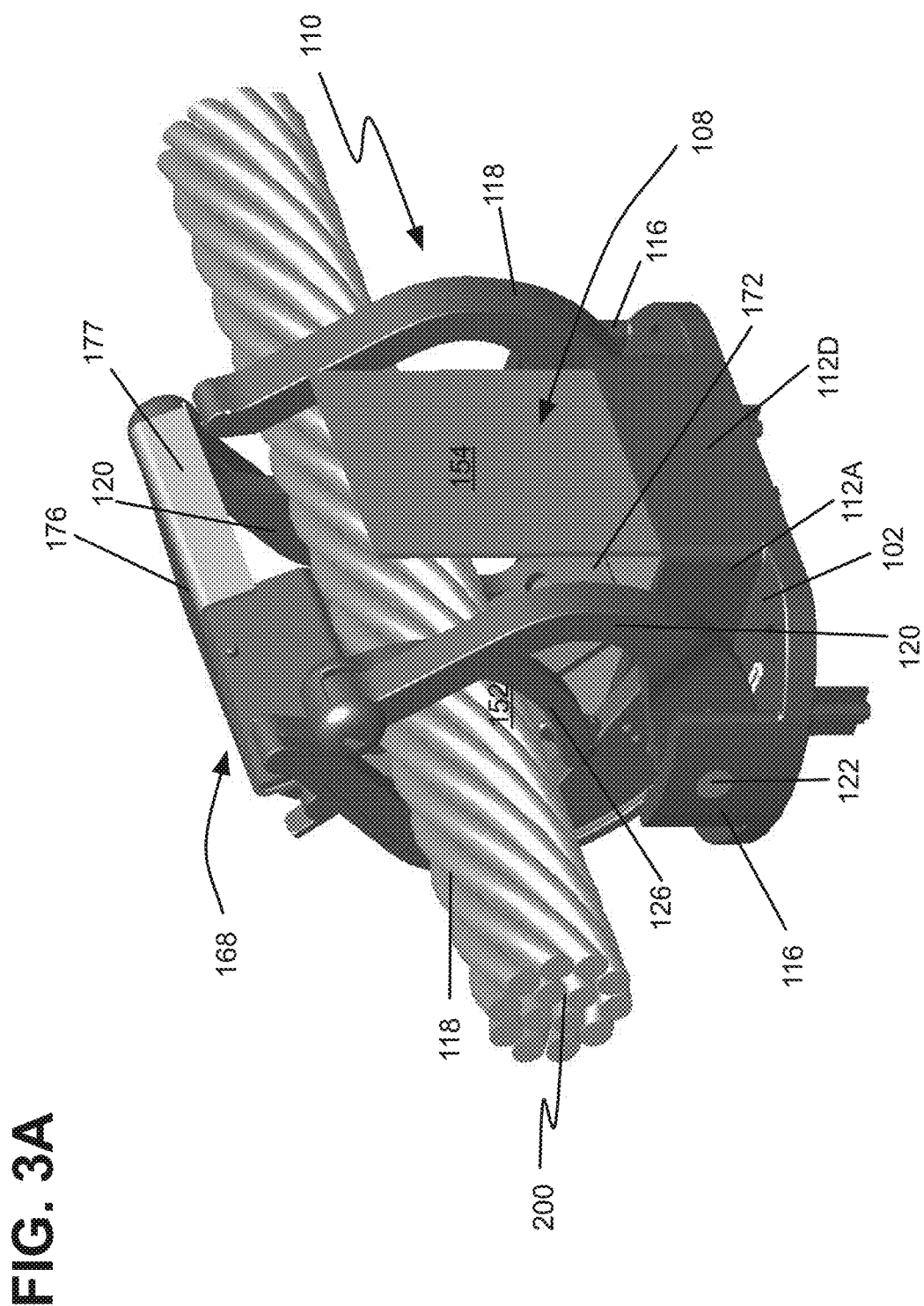
FIGS. 3A and 3B are front and rear isometric illustrations, respectively, of the top housing, laminate structure, and clamp mechanism of FIG. 1 in an intermediate configuration.
Figure 3B:
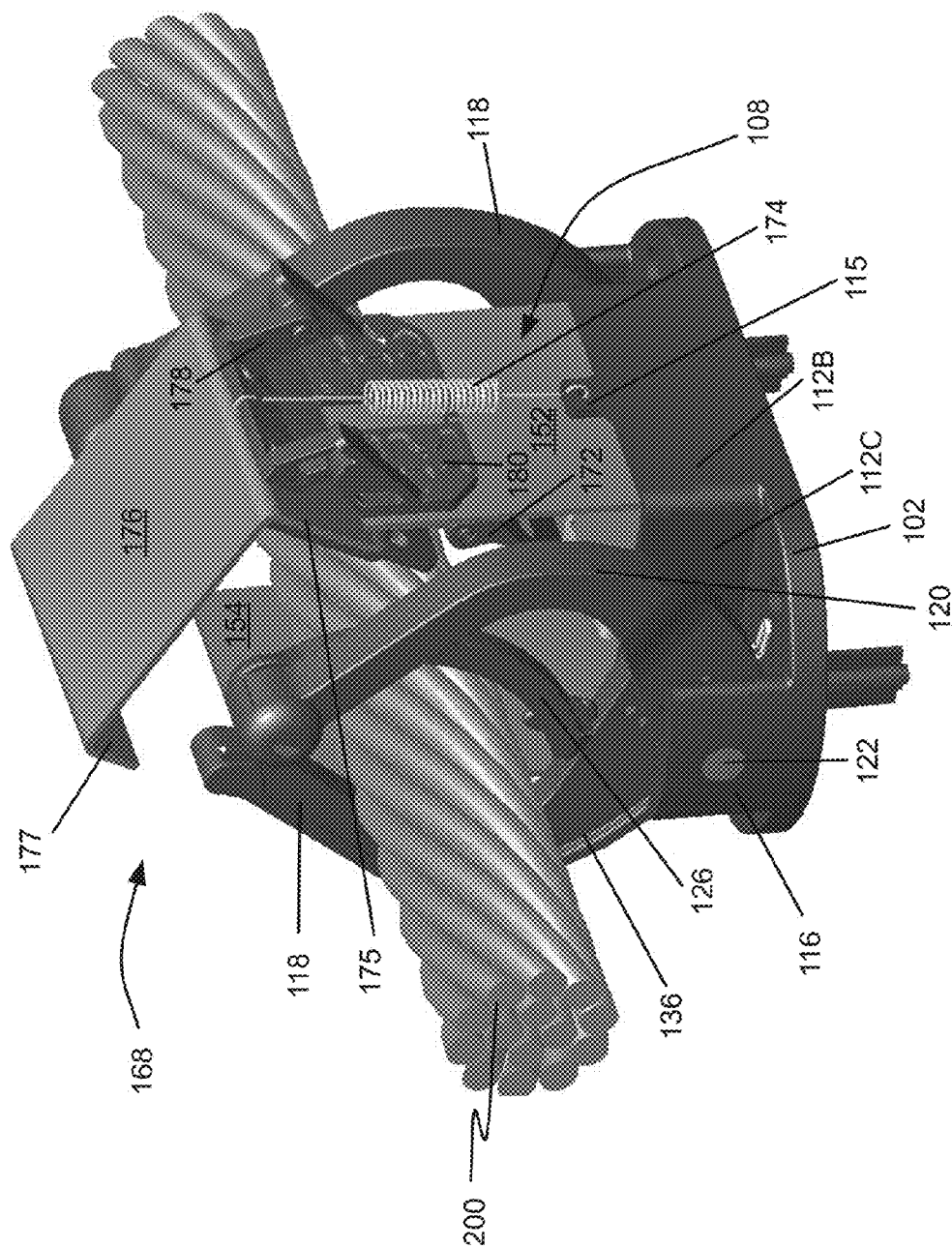
Figure 3D:
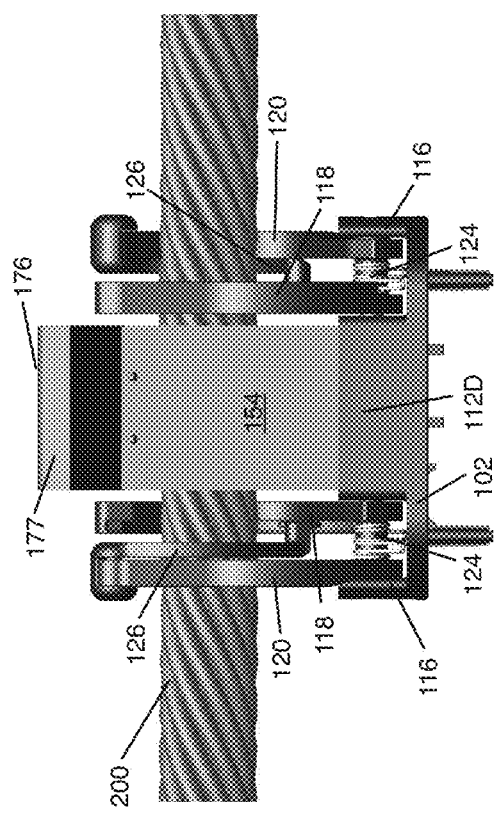
FIGS. 3C-3E are side, front, and top views, respectively, of the top housing, laminate structure, and clamp mechanism of FIG. 1 in the intermediate configuration.
Figure 3E:
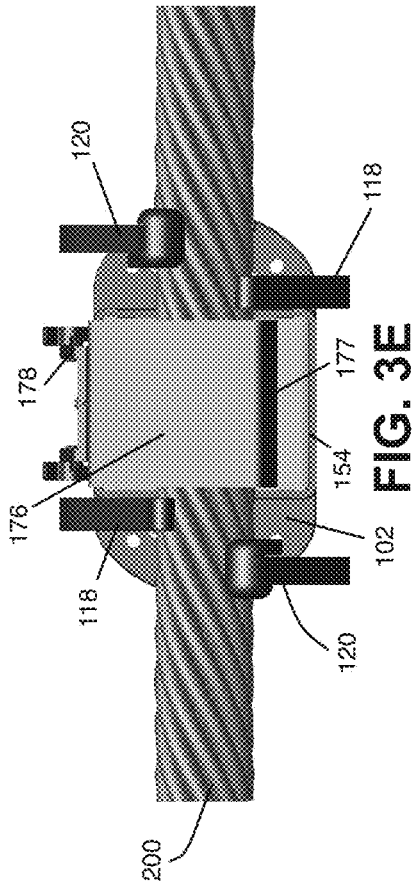
Figure 3C:
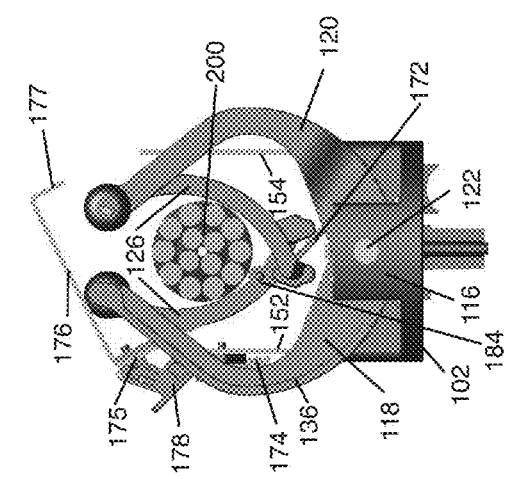
Figure 4A:
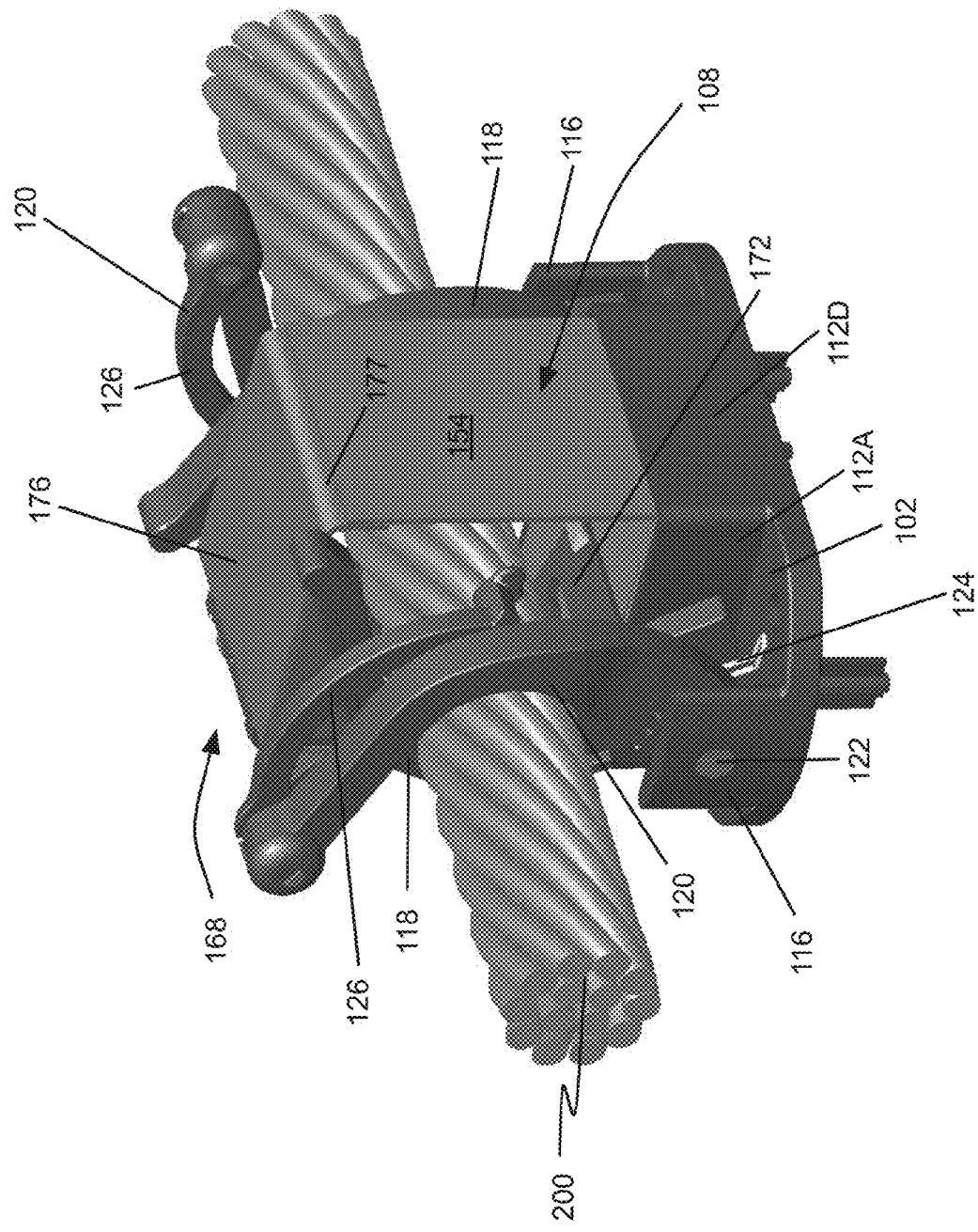
FIGS. 4A and 4B are front and rear isometric illustrations, respectively, of the top housing, laminate structure, and clamp mechanism of FIG. 1 in a closed or installed configuration.
Figure 4B:
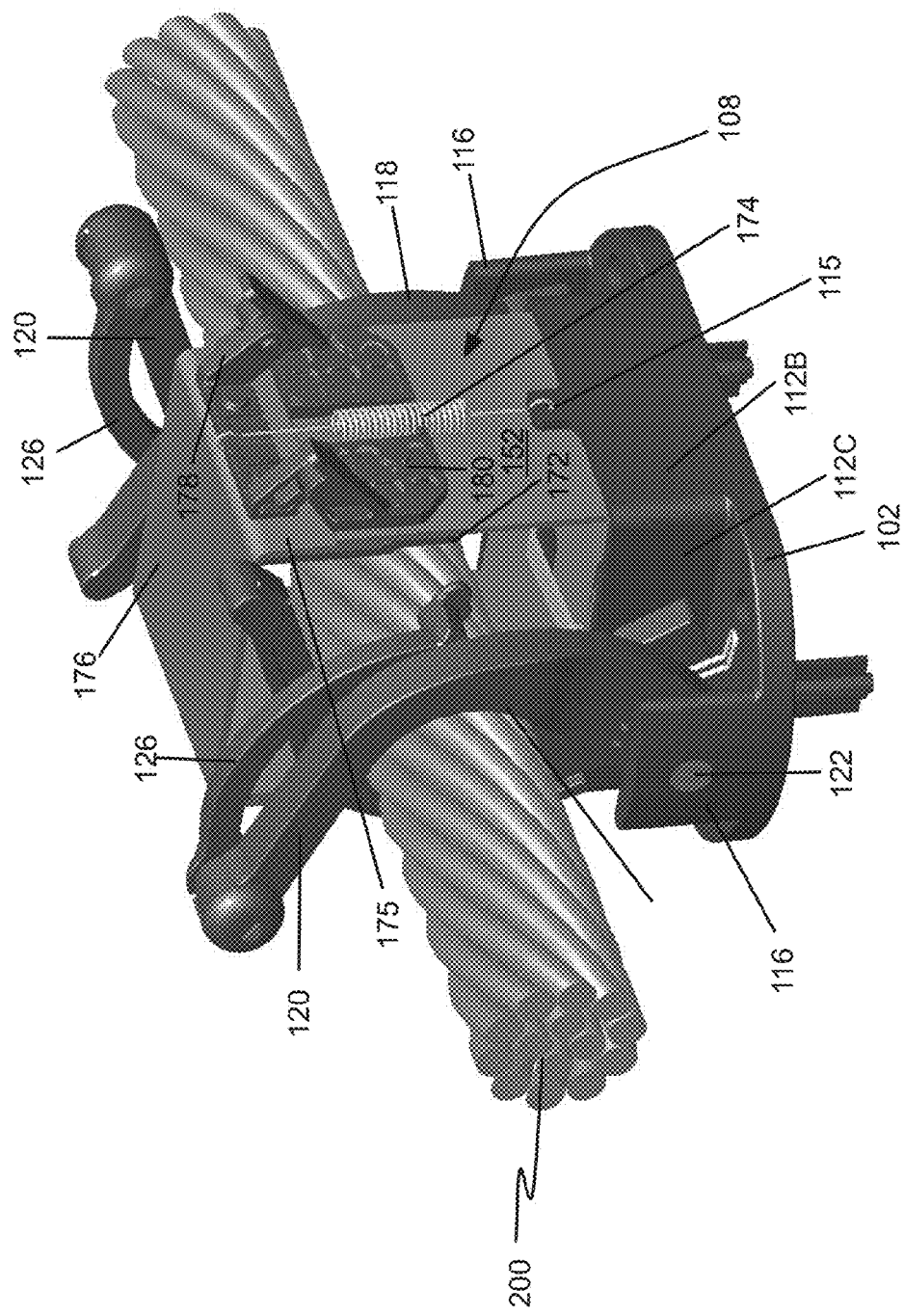

FIG. 1 is an isometric illustration of an exemplary FCI device 100. As illustrated in FIG. 1, FCI device 100 may include a top housing 102, a body housing 104, a laminate structure 108, and a clamp mechanism 110. FIGS. 2A and 2B are front and rear isometric illustrations, respectively, of top housing 102, laminate structure 108, and clamp mechanism 110 in an open configuration. FIGS. 2C-2E are side, front, and top views, respectively, of top housing 102, laminate structure 108, and clamp mechanism 110 in the open configuration. FIGS. 3A and 3B are front and rear isometric illustrations, respectively, of top housing 102, laminate structure 108, and clamp mechanism 110 in an intermediate configuration. FIGS. 3C-3E are side, front, and top views, respectively, of top housing 102, laminate structure 108, and clamp mechanism 110 in the intermediate configuration. FIGS. 4A and 4B are front and rear isometric illustrations, respectively, of top housing 102, laminate structure 108, and clamp mechanism 110 in a closed configuration. FIGS. 4C-4E are side, front, and top views, respectively, of top housing 102, laminate structure 108, and clamp mechanism 110 in the closed configuration.

As shown collectively in FIGS. 1-4E, top housing 102 may be configured to fixedly retain laminate structure 108 thereto as well as hingedly retain the components of clamp mechanism 110 thereto. Body housing 104 may be secured to a bottom surface of top housing 102 and may function to enclose or contain the sensing and indication components for FCI device 100. Such sensing and indication components may operate to, in conjunction with laminate structure 108, sense or otherwise determine a value representative of the current flowing through a power cable secured within laminate structure 108 via clamp mechanism 110. The components then determine whether the determined value is indicative of a fault in the power line and, if so, cause an indication of such fault to be activated.

In some embodiments, body housing 104 may house a printed circuit board having the appropriate sensing circuitry configured thereon. Furthermore, body housing 104 may also house one or more indicator means, such as a magnetic flag assembly, one or more light emitting diodes, a radio frequency transmitter, etc. Lastly, as shown in FIG. 1, body housing 104 may also include an installation hook 105, such as an eye hook, for allowing a technician to easily install and or remove the FCI device 100 from a power line, such as power line 200 shown in FIGS. 2A-4E.

Figure 5A:
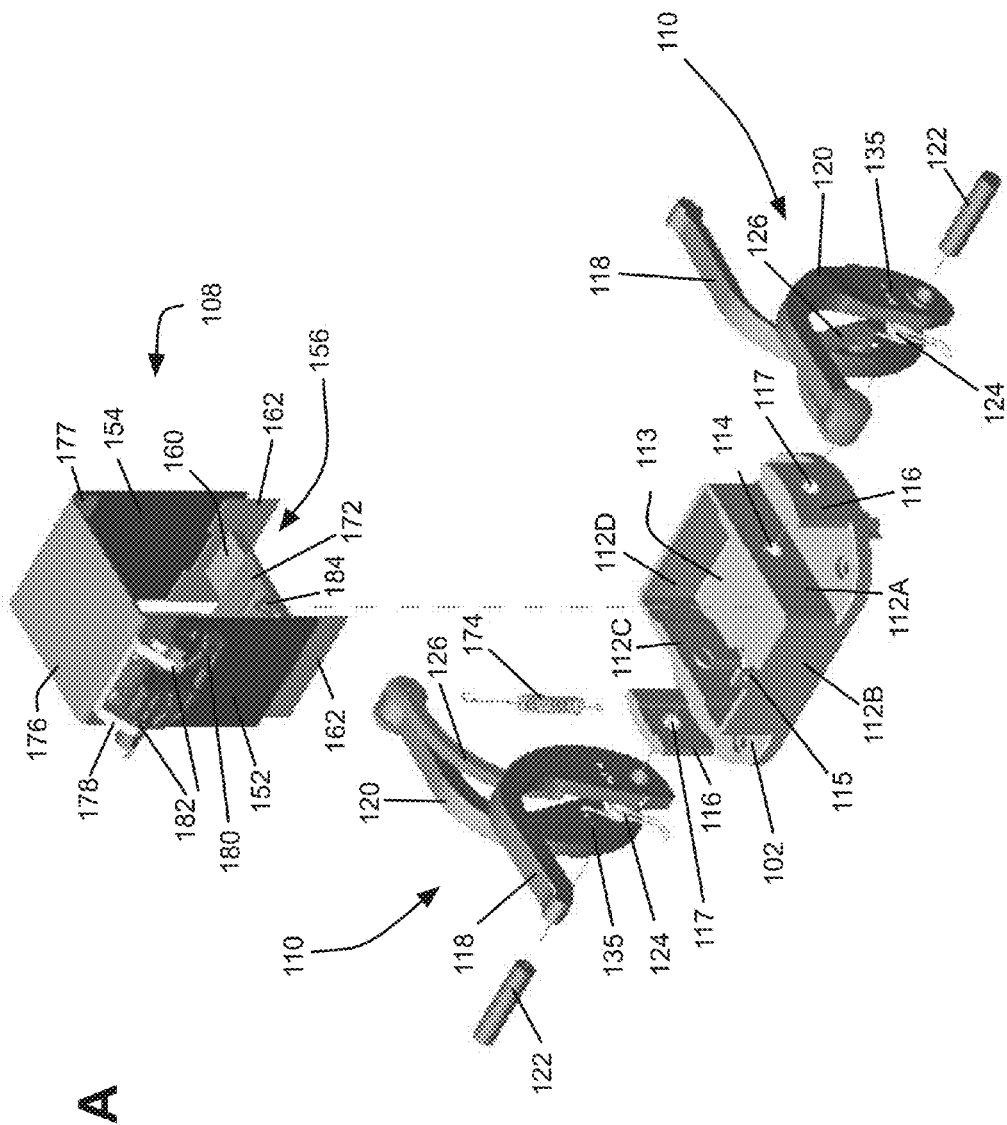
FIG. 5A is an exploded isometric view of the top housing and laminate structure of FIG. 1.
Figure 5B:
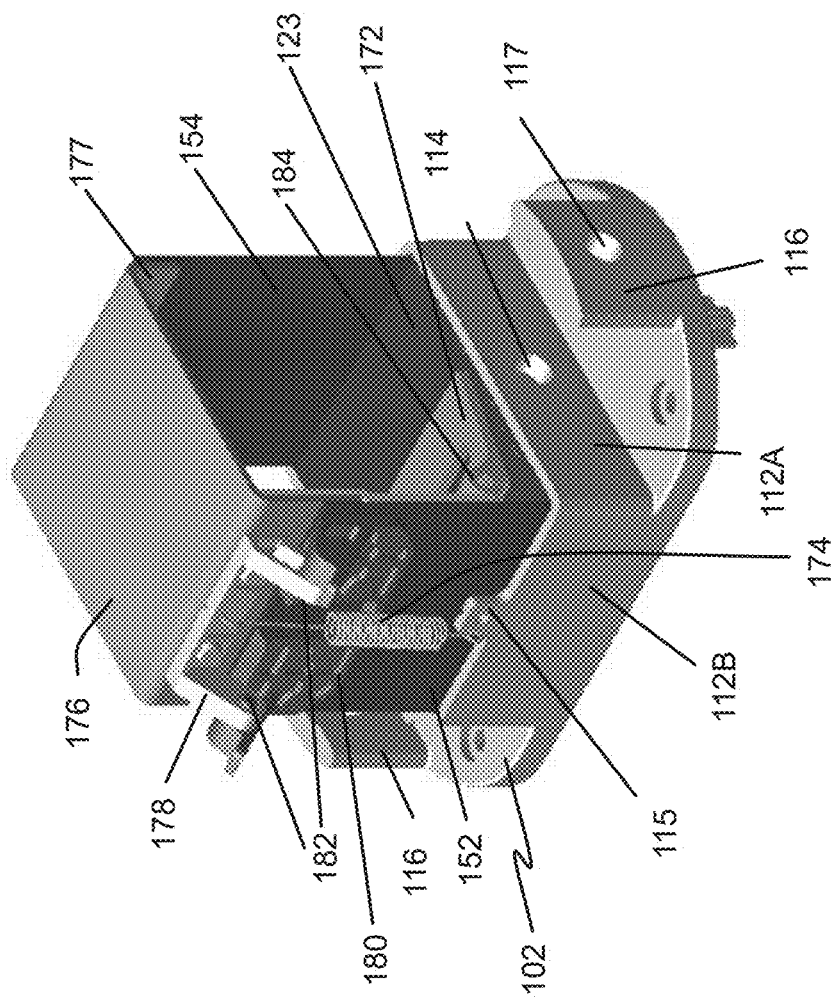
FIG. 5B is an isometric view of the top housing and laminate structure of FIG. 1 in an assembled configuration.

FIG. 5A is an exploded isometric view of top housing 102 and laminate structure 108. FIG. 5B is an isometric view of top housing 102 and laminate structure 108 in an assembled configuration. As shown in FIG. 5A, top housing 102 may include sidewalls 112A-112D that together form a cavity 113 that receives one end of laminate structure 108. As shown, sidewalls 112A and 112C include cylindrical cavities 114 formed therein for engaging clamp shafts 122, described in detail below. Sidewall 112B includes a laminate spring supporting member 115, as also described in detail below. Top housing 102 also includes clamp support members 116 spaced apart from sidewalls 112A and 112C and having cylindrical apertures 117 formed therethrough. Clamp support members 116 may be configured to further support clamp shaft 122 and retain clamp mechanism 110 to top housing 102, as described below.

As shown in FIG. 5B, during assembly, laminate structure 108 may be seated within cavity 113 and secured via a potting compound 123, such as a thermo-setting plastic or silicone rubber gel. Additional details regarding laminate structure will be described in detail below, with respect to FIG. 7.

Figure 6:
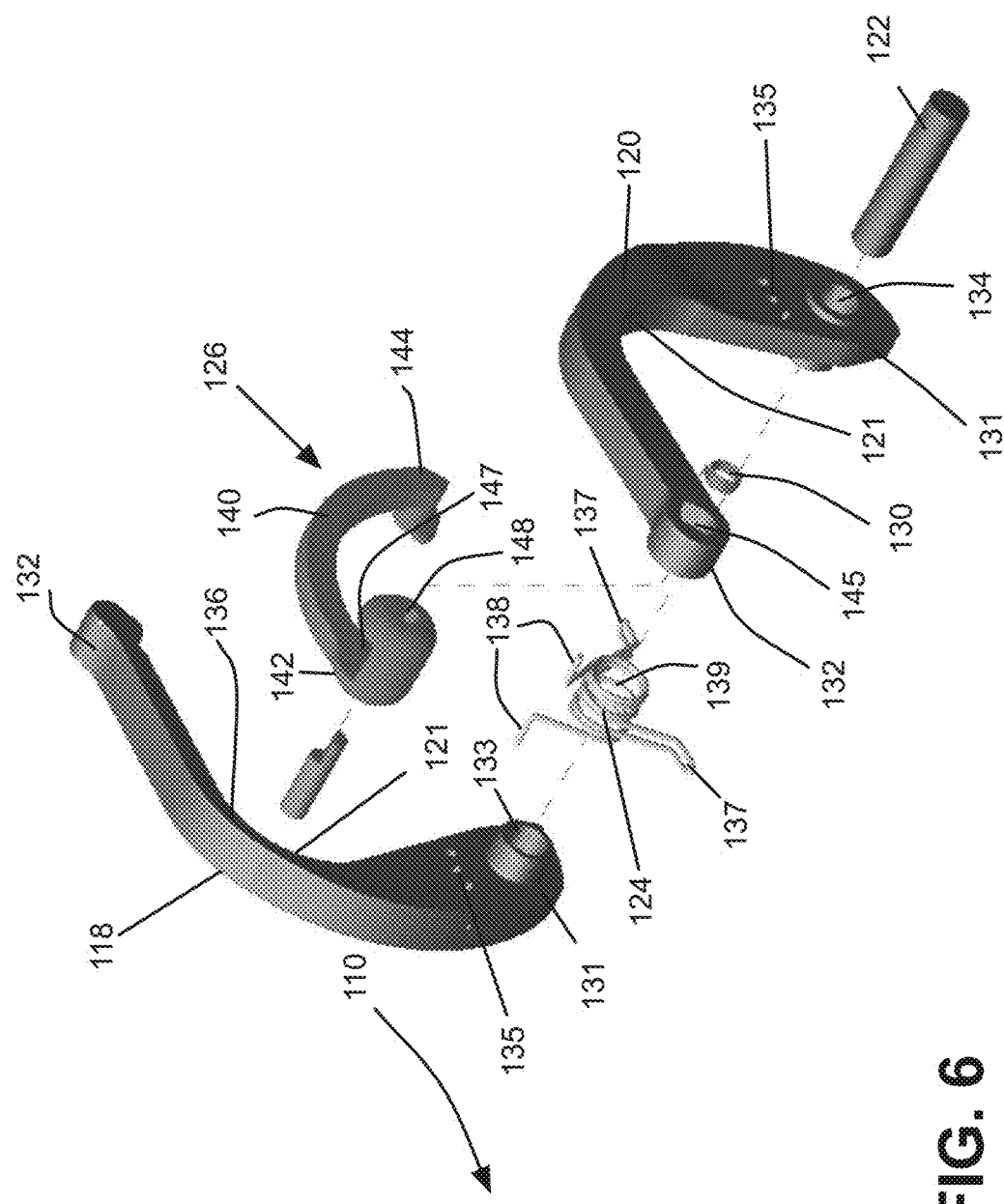
FIG. 6 is an exploded isometric view of one side of the clamp mechanism of FIG. 1.

FIG. 6 is an exploded isometric view of one side of clamp mechanism 110. It should be understood that the opposing side of clamp mechanism 110 includes similar features. As shown in FIGS. 1, 2A, and 6, clamp mechanism 110 may include an inside clamp arm 118, an outside clamp arm 120, a clamp shaft 122, a clamp spring 124, a trigger arm 126, a trigger arm shaft 128, and a trigger spring 130. As shown in FIG. 6, clamp arms 118 and 120 include opposingly curved configurations configured to form a substantially U or horseshoe shape when in the open position (FIG. 2A) and to cross each other in a scissor configuration, when in the closed position (FIG. 4A). For clarity, the inside surface of each clamp arm 118 and 120 may be referred to as power line engaging surface 121. In some implementations, at least a portion of power line engaging surface 121 may include a textured (e.g., knurled, ridged, pebbled, etc.) surface or may be covered or coated with a resilient or textured material, such as a plastic, rubber, or elastomeric material. Such a surface characteristic may increase friction between clamp arms 118 and 120 on power line 200, when the clamp arms 118 and 120 are closed about power line 200. In any event, the scissor like configuration of clamp arms 18 and 120 provides an improved clamp action that prevents or reduces the likelihood that FCI device 100 will travel axially down power line 200 after installation.

In addition, providing clamp arms 118 and 120 in opposing curved configurations allows clamp mechanism 110 to accurately maintain power line 200 centered within laminate structure 108 when in the closed or clamped position over a range of power line diameters (i.e., irrespective of the size of the particular power line to which FCI device 100 is affixed), as shown in FIGS. 4A and 4C. For example, a larger diameter power line may cause clamp arms 118 and 120 to remain open more fully, while a smaller diameter power line may cause clamp arms 118 and 120 to open less fully, with power line 200 being centered within laminate structure in either scenario by virtue of the shape of clamp arms 118 and 120. As shown in FIG. 6, in one embodiment, clamp arms 118 and 120 may include opposing substantially L-shaped configurations. That is, the curves of each of clamp arms 118 and 120 may extend through approximately 90 degrees. Further, by reliably centering the power line within laminate structure 180, accuracy and repeatability of current readings by FCI device 100 are improved.

As shown in FIG. 6, inside clamp arm 118 and outside clamp arm 120 each include hinge ends 131 and distal ends 132. Hinge ends 131 include apertures 133 and 134 therethrough, respectively, for receiving clamp shaft 122. In addition, as described below, clamp arms 118 and 120 also include one or more spring tension selection holes 135 positioned proximate to apertures 133 or 134.

Further, as shown in FIG. 2A, consistent with an exemplary implementation, inside clamp arm 118 is configured to include a recessed, trigger arm engaging surface 136. As described below, trigger arm engaging surface 136 may be configured as a flange or longitudinal extension of inside clamp arm 118 designed to capture or otherwise retain a free end of trigger arm 126, as the clamp mechanism 110 moves between the open and closed positions. In some embodiments, inside clamp arm 118 may further include a trigger arm retaining hook 141 at distal end 132 of inside clamp arm 118. As shown in FIG. 2A-2C, trigger arm retaining hook 141 functions to retain abutment end 144 of trigger arm 126 in connection with trigger arm engaging surface 136 of inside clamp arm 118 when clamp mechanism 110 is in the open position.

As shown in FIG. 6, clamp spring 124 comprises a helical type bias spring is configured to configured to, upon assembly, bias clamp arms 118 and 120 toward each other (i.e., into the closed position, which may also be referred to as a scissored relationship). In particular, clamp spring 124 is formed of concentric rings of, for example, spring steel, stainless steel, aluminum, or another resilient material. Further, an exemplary clamp spring 124 may be formed to include base portions 137, end portions 138, and a central opening 139 through which clamp shaft 122 may be received. As described below, during assembly, end portions 138 of clamp spring may be inserted into suitable spring tension selection holes 135 on clamp arms 118 and 120, the selection of which is based on a desired amount of spring tension, with the selection of interior spring tension selection holes 135 (i.e., toward the direction of curvature of the respective clamp arm 118/120) resulting in increased spring tension, and thus enhanced clamping force.

During assembly, inside clamp arm 118 may be positioned adjacent to cavity 114 in sidewall 112A (or 112C), such that aperture 133 is aligned with cavity 114. One end of clamp spring 124 may be positioned adjacent to aperture 133 in inside clamp arm 118, such that opening 139 is aligned with aperture 133, and the other end of clamp spring 124 may be positioned adjacent to aperture 134 in outside clamp arm 120, such that opening 139 is aligned with aperture 134. Base portions 137 of clamp spring 124 are positioned downwardly, and the end portions 138 are place into selected spring tension selection holes 135. The other side of outside clamp arm 120 is positioned within clamp support member 116, such that aperture 134 in outside clamp arm 120 is adjacent to and aligned with cylindrical aperture 117 in clamp support member 116. Clamp shaft 122 is then inserted through aperture 117 in clamp support member 116, aperture 134 in outside clamp arm 120, opening 139 in clamp spring 124, aperture 133 in inside clamp arm 118, and cavity 114 in sidewall 112A to secure clamp arms 118 and 120 to top housing 102.

As shown in FIG. 6, trigger arm 126 includes a substantially arcuate arm member 140 having a hinge end 142 and an abutment end 144. Hinge end 142 of trigger arm 126 is rotatably coupled to opening 145 in distal end 132 of outside clamp arm 120 by trigger arm shaft 128. In particular, in one embodiment, hinge end 142 includes a cavity 147 therein for receiving distal end 132 of outside clamp arm 120. Further, hinge end 142 also includes apertures 148 therethrough for aligning with apertures 145 in distal end 132. As described herein, the arcuate or curved shape of trigger arm 126 forms a concave surface for receiving a power line during installation. In particular, the curved shape may engage a cylindrical outer surface of the power line and direct or funnel the power line centrally between clamp arms 118 and 120 when FCI 100 is in the open position and as FCI 100 moves from the open to closed positions, as shown in FIGS. 2A-4E.

During assembly, distal end 132 of outside clamp arm 120 is inserted into cavity 147 of hinge end 142 of trigger arm 126 and trigger spring 130 is also inserted into cavity 147, such that one end of trigger spring 130 is affixed to outside clamp arm 120 and the other end of trigger spring 130 is affixed to trigger arm 126. Trigger arm shaft 128 is inserted through apertures 146 and 148, and through a central opening in trigger spring 130 to secure trigger arm 126 to outside clamp arm 120. This relationship creates a biased spring force between trigger arm 126 to outside clamp arm 120, such that trigger arm 126 is urged upwardly relative to outside clamp arm 120. This upward urging causes abutment end 144 of trigger arm 126 to slidingly engage trigger arm engaging surface 136, thus causing inside clamp arm 118 to open with respect to outside clamp arm 120. As described below, during installation onto a power line, forceful insertion of the power line against trigger arms 126 opposes the natural bias of trigger spring 130 and causes the trigger arms 126 to move downwardly within clamp mechanism 110, and further allowing the natural clamping bias of clamp arms 118 and 120 (e.g., via clamp spring 124) to cause clamp arms 118 and 120 to close about the inserted power line, as shown in FIGS. 3A-4E.

Figure 7:
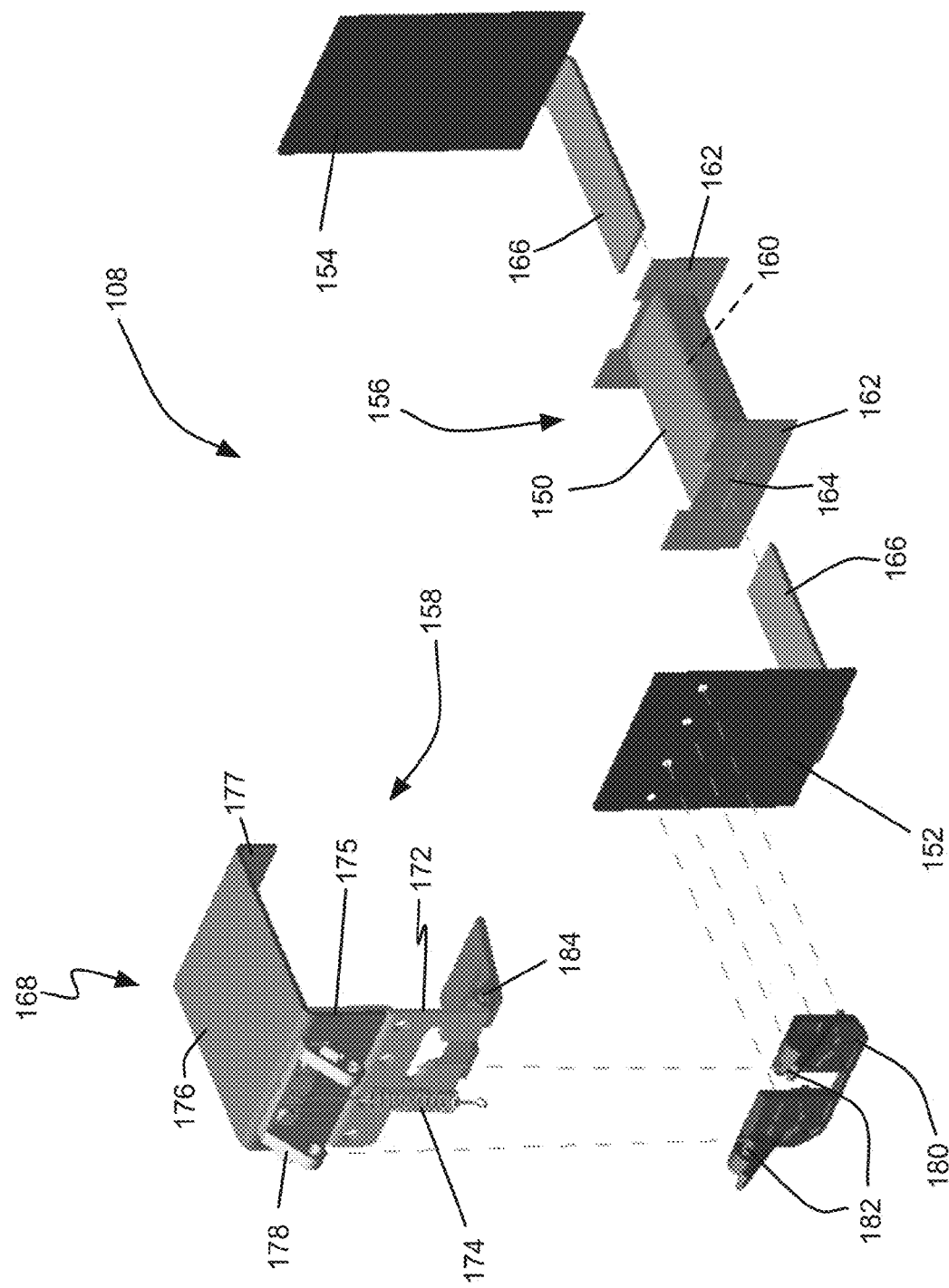
FIG. 7 is an exploded view of the laminate structure of FIG. 1 according to an exemplary embodiment.

FIG. 7 is an exploded view of laminate structure 108 according to an exemplary embodiment. As described briefly above, laminate structure 108 is configured to enclose the power line when the power line is fully inserted within clamp arms 118/120 and to couple flux arising from the current in the power line to a coil winding 150. As shown in FIG. 7, laminate structure 108 includes ferromagnetic laminate sides 152 and 154, a ferromagnetic winding assembly 156 that includes the coil winding 150, and a top laminate assembly 158.

In one implementation, winding assembly 156 may include a winding core 160 having a central element (not visible in FIG. 7), and side elements 162 for retaining coil winding 150. As shown in FIG. 7, winding core 160 may include a passageway therethrough configured to align with openings 164 in side elements 162. As also shown in FIG. 7, ferromagnetic laminate sides 152 and 154 include a pair of generally planar structures having mounting brackets 166 projecting substantially perpendicularly therefrom. The mounting brackets 166 are sized for insertion though openings 164 and the passageway in core 160 to allow laminate sides 152 and 154 to be secured to winding assembly 156. During assembly of FCI device 100, laminate sides 152 and 154 are coupled to ferromagnetic winding assembly 156 via mounting brackets 166 inserted through openings 164.

In one embodiment, the openings 164, passageway in core 160, and mounting brackets 166 may be substantially rectangular in configuration. As described above, and shown in FIG. 5B, the assembled combination of laminate sides 152 and 154 and winding assembly 156 are receiving within cavity 113 in top housing 102 during assembly of FCI device 100.

As shown in FIGS. 1 and 7, top laminate assembly 158 is configured to hingedly enclose power line 200 when power line 200 is fully inserted and clamped into FCI device 100, as shown in FIGS. 4A-4E. In this manner, top laminate assembly 158 completes the uninterrupted conductive enclosure formed by laminate structure 108 by conductively coupling laminate side 152 to laminate side 154 when in the closed position. In one exemplary embodiment, top laminate assembly 158 includes top laminate element 168, top laminate hinge assembly 170, power line receiving element 172, and top laminate spring 174.

Consistent with embodiments described herein, top laminate element 168 comprises a substantially C-shaped member having a first leg 175, a top 176, and a second leg 177 formed of a conductive member, where each of first leg 175 and second leg 177 project substantially perpendicularly downwardly from top 176. As shown in FIG. 4A, top 176 may be sized similarly to a spacing between laminate sides 152 and 154, such that, when in the closed position, first leg 175 and second leg 177 are engaged between laminate sides 152 and 154, thus forming a conductive loop about the enclosed power line.

To facilitate opening and closing of top laminate assembly 158, top laminate element 168 is secured to side 152 via top laminate hinge assembly 170 and power line receiving element 172 is configured to engagingly received the power line onto which the FCI device 100 is to be installed. More particularly, as shown in FIG. 7, top laminate hinge assembly 170 comprises a top hinge 178 that is secured to a portion of first leg 175 and a bottom hinge 180 that is secured to a portion of laminate side 152. Top hinge 178 and bottom hinge 180 are pivotally secured to each other via one or more hinge pins 182. In one exemplary embodiment, top laminate hinge assembly 170 is configured to pivot about pins 182 at a predefined spacing extended from the plane of first laminate side 152, such that rotation of top laminate element 168 about pins 182 causes first leg 175 (and second leg 177) to completely clear laminate side 152, thus enabling the power line to be easily received by trigger arms 126 without a concern that the power line would engage abut top laminate element 168.

For example, as shown in FIG. 7, bottom hinge 180 may include hinge arms that project outwardly from bottom hinge 180 and include pins 182. Top hinge 178 may include corresponding hinge arms that project outwardly from top hinge and engage pins 182 in the bottom hinge 180. Other hinge configurations may be utilized, without departing from the scope of the described embodiments. In any event, top hinge 178 and bottom hinge 180 may be secured to leg 175 and side 152 in any suitable manner, such as using screws, bolts, welds, or an adhesive.

To facilitate closing of top laminate assembly 158, power line receiving element 172 is configured to extend into the opening formed between laminate sides 152 and 154 when top laminate assembly 158 is in the open position. For example, power line receiving element 172 may comprise a substantially planar element secured to and projecting from first leg 175 such that, when top laminate assembly 158 is in the open position, power line receiving element 172 engages power line 200. Upon continued advancement of FCI device 100 toward power line 200, power line 200 engages power line receiving element 172 and causes power line receiving element 172 and hence, top laminate assembly 168 to which it is fixedly coupled, to rotate downwardly about pivot pins 182. As FCI device 100 is continually advanced toward power line 200, second leg 177 of top laminate element 168 is urged into mating arrangement with laminate side 154. As shown in FIG. 4A, in one exemplary embodiment, second leg 177 engages an inside surface of laminate side 154, while in other embodiments, second leg of top laminate element 168 may engage an outside surface of laminate side 154. In exemplary embodiments, power line receiving element 172 is formed of a nonconductive material, such as a plastic or polymer.

As shown in FIGS. 2A and 7, in one implementation, power line receiving element 172 may include a hinge 184 in an intermediate portion thereof, which allows a portion of power line receiving element 172 distal from first leg 175 to rotate relative to a portion of power line receiving element 172 proximal to first leg 175. Further, in such an embodiment, a length of power line receiving element 172 may be greater than a height of laminate side 152. Such geometry ensures that power line receiving element 172 bends about hinge 184 so that at least a portion of power line receiving element 172 remains in contact with power line 200 as power line 200 is received within sides 152/154. This action, in turn, ensures that second leg 177 is positively urged into engagement with laminate side 154 for power lines of varying diameters.

To further facilitate efficient and reliable opening and closing of top laminate assembly 158, top laminate spring 174 may be affixed to top hinge 178 and top housing 102. For example, as shown in FIGS. 2B, 3B, and 4B, top housing 102 may include spring supporting member 115 for receiving one end of top laminate spring 174 (e.g., a helical spring formed of a material, such as aluminum). Similarly, top hinge 178 may include an engagement portion 188, such as a notch or a hole, for receiving an opposing end of top laminate spring 174.

Because pivot pins 182 are provided spaced outwardly from laminate side 152 (as described above), top laminate spring 174 operates to assist in both the opening and closing of top laminate assembly 158. More particularly, as shown in FIG. 2B, when top laminate assembly 158 is in the open position, the tension in spring 174 functions to maintain top laminate assembly 158 in the open position by exerting a downward force on a portion of top hinge 178 which extends laterally outside of pivot pins 182. This downward force causes top laminate assembly 158 to remain open even when FCI device 100 is moved or subjected to environmental stresses, such as wind.

As described above, movement of FCI device 100 onto power line 200 causes power line receiving element 172 to move downwardly, which thus causes top laminate assembly 158 to rotate about pivot pins 182, thereby countering the resistive force of spring 174. As top laminate assembly 158 closes, engagement portion 188 of top hinge 178, to which spring 174 is affixed, passes over pivot pins 182, as shown most clearly FIG. 4C. This shift in the position of engagement portion 188 causes spring 174 to exert a downward force on top laminate assembly 158 which urges the assembly further into the closed position and assists in retaining top laminate assembly 158 in the closed position.

By providing an FCI device 100 with clamp mechanism 110 and laminate structure 108, FCI device 100 may be easily and confidently secured to and removed from power line 200. More specifically, consistent with embodiments described herein, FCI device 100 includes opposing pairs of scissor-style, spring-loaded, clamp arms 118 and 120 configured to be spring biased into a position surrounding power line 200. In an open position, as shown in FIG. 2A-2E, spring-loaded trigger arms 126 maintain clamp arms 118 and 120 in a separated configuration for receiving power line 200 therebetween. Movement of FCI device 100 toward power line 200 causes power line 200 to urge trigger arms 126 downward, thus allowing spring-loaded clamp arms 118 and 120 to travel toward each other to clamp power line 200 therebetween.

As described herein, laminate structure 108 is configured to allow power line 200 to enter laminate sides 152 and 154 with top laminate assembly 158 in an open position, and to automatically close top laminate assembly 158, when power line 200 is received between laminate sides 152 and 154 and engaged by clamp arms 118 and 120 (as described above). In particular, top laminate assembly 158 may be hingedly coupled to laminate side 152 and power line receiving element 172 may extend from top laminate assembly 158 and into the space between laminate sides 152 and 154, when top laminate assembly 158 is in the open position. In this manner, power line receiving element 172 engages the received power line and urges it within laminate sides 152 and 154, thus causing top laminate assembly 158 to rotate into the closed position as power line 200 is secured.

FCI device 100 may be removed from power line 200 is a reverse operation. That is, forcibly pulling downwardly on FCI device 100 causes power line 200 to engage both top laminate assembly 158 and clamp arms 118 and 120. This force causes clamp arms 118 and 120 to open relative to each other, and further causes top laminate assembly to rotate back into the open position, thus releasing FCI device 100 from power line 200. As clamp arms 118 and 120 fully open, trigger arms 126 return to engaged positions between clamp arms 118 and 120, thus maintaining clamp arms 118 and 120 in the open position, even after removal of FCI device 100 from power line 200. Similarly, as top laminate assembly 158 returns to its open position (as urged by power line 200), laminate spring 174 exerts to a downward force on top laminate assembly 158 to also retain top laminate assembly 158 in is open position, ready for re-installation onto power line 200.

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments.

For example, various features have been mainly described above with respect to faulted circuit indicator devices. In other implementations, features described herein may be implemented in relation to other clamp on type devices, such as lighting, signage, audio-visual equipment (cameras, speakers, etc.), etc.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above-mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. A faulted circuit indicator (FCI) device for installation on a power line, comprising:
    a housing;
    a laminate structure fastened to the housing and configured to receive the power line;
    a clamp mechanism pivotally fastened to the housing and configured to secure the housing to the power line, wherein the clamp mechanism includes a pair of opposing clamp arms each having a curved configuration, wherein the curved configuration of the clamp arms maintains the power line in a centered relationship within the laminate structure when the clamp arms are engaged on the power line over a range of power line diameters; and
    a spring-loaded trigger arm pivotally coupled to one of the pair of clamp arms and configured to engage the other of the pair of clamp arms when the clamp arms are in an open configuration.

2. The FCI device of claim 1, wherein the clamp arms comprise opposing L-shaped members.

3. The FCI device of claim 1, wherein the pair of opposing clamp arms comprise spring biased clamp arms.

4. The FCI device of claim 1, wherein each of the clamp arms comprise a hinge end coupled to the housing and a distal end opposite from the hinge end,
    wherein the trigger arm is pivotally coupled to the distal end of the one of the pair of clamp arms and is spring biased to forcibly engage the other of the pair of clamp arms.

5. The FCI device of claim 4, wherein the other of the pair of clamp arms comprises a trigger arm engaging surface for engaging an end of the trigger arm coupled to the one of the pair of clamp arms,
    wherein, absent other forces, engagement of the end of the spring-loaded trigger arm against the trigger arm engaging surface causes the pair of clamp arms to open relative to each other.

6. The FCI device of claim 5, wherein the trigger arm engaging surface comprises an extension flange projecting from the other of the pair of clamp arms along a length of the other of the pair of clamp arms.

7. The FCI device of claim 1, wherein the trigger arm comprises a curved surface for engaging the power line when the FCI device is in the open configuration.

8. The FCI device of claim 1, further comprising a clamp spring for biasing the pair of clamp arms towards each other,
    wherein the each of the pair of clamp arms include a plurality of spring tension selection holes for allowing adjustments to an amount of tension exerted by the clamp spring.

9. The FCI device of claim 8, wherein the top laminate assembly comprises a generally C-shaped element having a first leg, a second leg, and a top,
    wherein the first leg of the top laminate assembly is hingedly coupled to the first laminate side, and
    wherein the second leg of the top laminate assembly engages the second laminate side when the FCI is in a closed configuration.

10. The FCI device of claim 9, wherein the hinged coupling between the first leg and the first laminate side comprises a hinge having a pivot point that is extended beyond a plane of the first laminate side sufficient to remove the top laminate assembly from overlaying a space between the first laminate side and the second laminate side, when the FCI device is in the open configuration.

11. The FCI device of claim 9, further comprising a dual action top laminate spring for biasing the top laminate member into both the open configuration and the closed configuration.

12. The FCI device of claim 11, wherein the dual action top laminate spring comprises a spring coupled to each of the hinge and the housing.

13. A faulted circuit indicator (FCI) device for installation on a power line, comprising:
    a housing;
    a laminate structure fastened to the housing and configured to receive the power line; and
    a clamp mechanism pivotally fastened to the housing and configured to secure the housing to the power line,
    wherein the clamp mechanism includes a pair of opposing clamp arms each having a curved configuration,
    wherein the curved configuration of the clamp arms maintains the power line in a centered relationship within the laminate structure when the clamp arms are engaged on the power line over a range of power line diameters, and
    wherein the laminate structure comprises:
        a winding assembly coupled to the housing;
        first and second laminate sides projecting substantially perpendicularly from the winding assembly in a spaced relationship relative to each other; and
        a top laminate assembly configured to automatically extend between the first laminate side and the second laminate side when the FCI device is installed onto the power line.

14. The FCI device of claim 13, wherein the top laminate assembly further comprises:
    a power line receiving element that projects from the top laminate assembly and into a space between the first laminate side and the second laminate side to engage the power line, when the FCI device is in the open configuration,
    wherein movement of the FCI device toward the power line causes the top laminate assembly to rotate from the open configuration to the closed configuration.

15. The FCI device of claim 14, wherein the power line receiving element comprises a generally planar element coupled to the first leg.

16. The FCI device of claim 14, wherein the power line receiving element comprises a first member hingedly coupled to a second member,
    wherein a combined length of the first member and the second member is longer than a length of the first laminate side.

17. A faulted circuit indicator (FCI) device for installation on a power line, comprising:
    a housing;
    a laminate structure fastened to the housing and configured to receive the power line; and
    a clamp mechanism pivotally fastened to the housing and configured to secure the housing to the power line, wherein the laminate structure comprises:
- a winding assembly coupled to the housing;
- first and second laminate sides projecting substantially perpendicularly from the winding assembly in a spaced relationship relative to each other; and
- a top laminate assembly configured to automatically extend between the first laminate side and the second laminate side when the FCI device is installed onto the power line.

18. The FCI device of claim 17, wherein the top laminate assembly comprises a generally C-shaped element having a first leg, a second leg, and a top,
   wherein the first leg of the top laminate assembly is hingedly coupled to the first laminate side, and
   wherein the second leg of the top laminate assembly engages the second laminate side when the FCI is in a closed configuration.

19. The FCI device of claim 18, wherein the hinged coupling between the first leg and the first laminate side comprises a hinge having a pivot point that is extended beyond a plane of the first laminate side sufficient to remove the top laminate assembly from overlaying a space between the first laminate side and the second laminate side, when the FCI device is in the open configuration.

20. The FCI device of claim 18, further comprising a dual action top laminate spring for biasing the top laminate member into both the open configuration and the closed configuration, wherein the dual action top laminate spring comprises a spring coupled to each of the hinge and the housing.

21. The FCI device of claim 17, wherein the top laminate assembly further comprises:
   a power line receiving element that projects from the top laminate assembly and into a space between the first laminate side and the second laminate side to engage the power line, when the FCI device is in the open configuration,
wherein movement of the FCI device toward the power line causes the top laminate assembly to rotate from the open configuration to the closed configuration.

22. The FCI device of claim 21, wherein the power line receiving element comprises a generally planar element coupled to the first leg.

23. The FCI device of claim 21, wherein the power line receiving element comprises a first member hingedly coupled to a second member,
   wherein a combined length of the first member and the second member is longer than a length of the first laminate side.

* * * * *